United States Patent
Anand et al.

(10) Patent No.: US 9,711,241 B2
(45) Date of Patent: Jul. 18, 2017

(54) METHOD AND APPARATUS FOR OPTIMIZED MEMORY TEST STATUS DETECTION AND DEBUG

(71) Applicant: QUALCOMM Incorporated, San Diego, CA (US)

(72) Inventors: Ashutosh Anand, Gangalore (IN); Shankarnarayan Bhat, Bangalore (IN); Nikhil Sudhakaran, Bangalore (IN); Praveen Raghuraman, Bangalore (IN); Nishi Bhushan Singh, Bangalore (IN); Anand Bhat, Bangalore (IN); Abhinav Kothiala, Bangalore (IN); Sanjay Muchini, Bangalore (IN); Arun Balachandar, Bangalore (IN); Devadatta Bhat, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 14/676,501

(22) Filed: Apr. 1, 2015

(65) Prior Publication Data
US 2016/0293272 A1     Oct. 6, 2016

(51) Int. Cl.
| G11C 29/00 | (2006.01) |
| G11C 29/38 | (2006.01) |
| G11C 29/44 | (2006.01) |
| G11C 29/12 | (2006.01) |

(52) U.S. Cl.
CPC .............. *G11C 29/38* (2013.01); *G11C 29/44* (2013.01); *G11C 2029/1208* (2013.01)

(58) Field of Classification Search
CPC .......... G11C 29/38; G11C 29/44; G11C 29/36
See application file for complete search history.

(56) References Cited

U.S. PATENT DOCUMENTS

| 5,982,681 | A | 11/1999 | Schwarz |
| 7,260,758 | B1 | 8/2007 | Agrawal et al. |
| 7,562,256 | B2 | 7/2009 | Yamauchi |
| 7,979,759 | B2 | 7/2011 | Carnevale et al. |
| 2003/0051197 | A1* | 3/2003 | Evans .................... G11C 29/12 |
| | | | 714/718 |
| 2008/0013390 | A1* | 1/2008 | Zipprich-Rasch ..... G11C 29/44 |
| | | | 365/201 |
| 2009/0013228 | A1 | 1/2009 | Jarboe, Jr. et al. |
| 2009/0282303 | A1* | 11/2009 | Andreev .......... G01R 31/31724 |
| | | | 714/718 |
| 2009/0300440 | A1* | 12/2009 | Andreev ................ G11C 29/32 |
| | | | 714/718 |

(Continued)

*Primary Examiner* — Thien D Nguyen
(74) *Attorney, Agent, or Firm* — Loza & Loza LLP

(57) ABSTRACT

Embodiments contained in the disclosure provide a method for memory built-in self-testing (MBIST). The method begins when a testing program is loaded, which may be from an MBIST controller. Once the testing program is loaded MBIST testing begins. During testing, memory failures are determined and written to a failure indicator register. The writing to the failure indicator register occurs in parallel with the ongoing MBIST testing. An apparatus is also provided. The apparatus includes a memory data read/write block, a memory register, a memory addressor, and a memory read/write controller. The apparatus communicates with the memories under test through a memory address and data bus.

18 Claims, 7 Drawing Sheets

(56) References Cited

U.S. PATENT DOCUMENTS

| | | | |
|---|---|---|---|
| 2009/0300441 A1* | 12/2009 | Andreev | G11C 29/32 714/718 |
| 2009/0307543 A1* | 12/2009 | Andreev | G11C 29/1201 714/718 |
| 2010/0125766 A1* | 5/2010 | Anzou | G06F 11/27 714/719 |
| 2012/0072788 A1* | 3/2012 | Chen | G11C 29/06 714/718 |

* cited by examiner

METHOD AND APPARATUS FOR OPTIMIZED MEMORY TEST STATUS DETECTION AND DEBUG

FIELD

The present disclosure relates generally to memory built in testing (MBIST) and more particularly to a method and apparatus for optimizing memory test status and debug procedures.

BACKGROUND

Today's designs for system-on-chip (SoC) may have more than one hundred embedded memories on a single chip. These memories may be scattered around the device instead of being concentrated in one location. Typically, these memories are of different types and sizes. In addition, these memories may be further embedded inside embedded cores. This structure poses a challenge to testing all of the memories on the chips, as test access may be limited to only a few input/output (I/O) pins.

Built in self-test (BIST) is frequently used to test such embedded memories within SoCs, as it provides a simple and low cost method of testing that does not affect performance. Specific testing may be required to test all of the memories on a device, which is known as memory built-in self-test (MBIST). As SoCs are used ever more widely in devices, such as mobile phones, the challenge becomes offering increased performance while maintaining a portable device. As devices gain performance and functionality, the number of memories to support that functionality grows, as does the need to test those memories. This may lead to congestion at the MBIST controller as all data path routing must pass through the controller.

In conventional memory test methodology test results are not captured concurrently with the testing process. Currently results are available only at the very end of test execution. This leads to a number of difficulties includes increased overhead caused by the serial shifting out of the pass/fail status, increased testing time, which may add 20% additional testing time, long running pre-silicon simulations, and higher debug and turn-around times.

The problem increases as memories grow ever larger. Larger memories may have as many as 64 output values that must be shifted out for every 100 memories being tested. The shifting out of results occurs in a serial, not parallel manner, which also increases the total test time. The increase may range form 5 ms to 20 ms per pattern.

There is a need in the art for a method and apparatus to overcome the limitation of reading out pass/fail signatures on test data output (TDO) pins serially at the end of testing.

SUMMARY

Embodiments contained in the disclosure provide a method for memory built-in self-testing (MBIST). The method begins when a testing program is loaded, which may be from an MBIST controller. Once the testing program is loaded MBIST testing begins. During testing, memory failures are determined and written to a failure indicator register. The writing to the failure indicator register occurs in parallel with the ongoing MBIST testing.

A further embodiment provides an apparatus for memory built-in self-testing. The apparatus includes a memory data read/write block, a memory register, a memory addressor, and a memory read/write controller. The apparatus communicates with the memories under test through a memory address and data bus.

A still further embodiment provides an apparatus for memory built-in self-testing (MBIST). The apparatus includes: means for loading a testing program; means for testing memories using the testing program; means for determining if any memory is failing; and means for writing to a failure indicator register in parallel with ongoing testing if any memory is failing.

DETAILED DESCRIPTION

Figure 1:
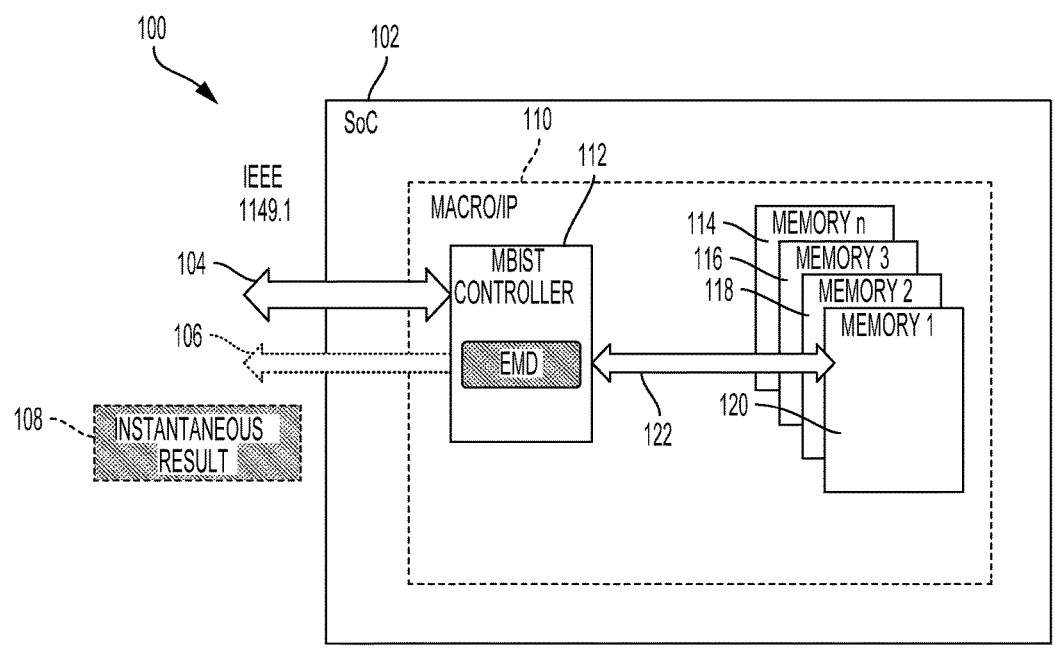
FIG. 1 is a block diagram of an apparatus for testing memory fail signatures in parallel in accordance with embodiments described herein.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

MBIST testing provides a mechanism that allows a memory to test itself. MBIST may be used to ensure high reliability and to lower repair cycle times. MBIST may also be used in situations where technician accessibility is limited or it is necessary to reduce testing costs in the manufacturing process. Costs are reduced because MBIST reduces the time needed for memory testing and also reduces the complexity of the test set up. Often, the number of I/O signals that need to be examined are reduced.

A general BIST architecture provides a test generator that interfaces with the circuit under test. The circuit under test receives input from the test generator and outputs a response verification. A test controller is connected to the test generator and also to a response verification device. The test controller generates control signals for the test pattern. These control signals are provided to the test pattern generator and the memory under test. The test pattern generator generates the required test patterns and the Read/Write signals. The comparator evaluates the response of the memory to the test signals.

FIG. 1 is a block diagram of an apparatus for testing memory fail signatures in parallel. The assembly 100 includes a system-on-chip 102, a communication bus 104, test data output (TDO) 106, and instantaneous results 108. Communication bus 104 may be a IEEE 1149.1 bus, or may be any suitable communication bus that provides the necessary output capability. Within SoC 102 is macro 110 which incorporates MBIST testing protocols within MBIST controller 112 and memories 114-120. MIBST controller 112 includes testing protocols, which may be created by the original equipment manufacturer of the SoC 102. However, other additional MBIST testing protocols may also be included within MBIST controller 112. While memories 114-120 are illustrated, in an actual device the number of memories may be much greater, with as many as several hundred memories requiring MBIST testing. Memories 114-120 are linked to the MBIST controller 112 through memory interface 122. Communication link 122 may be of any type suitable for passing testing instructions and results to MBIST controller 112.

Figure 2:
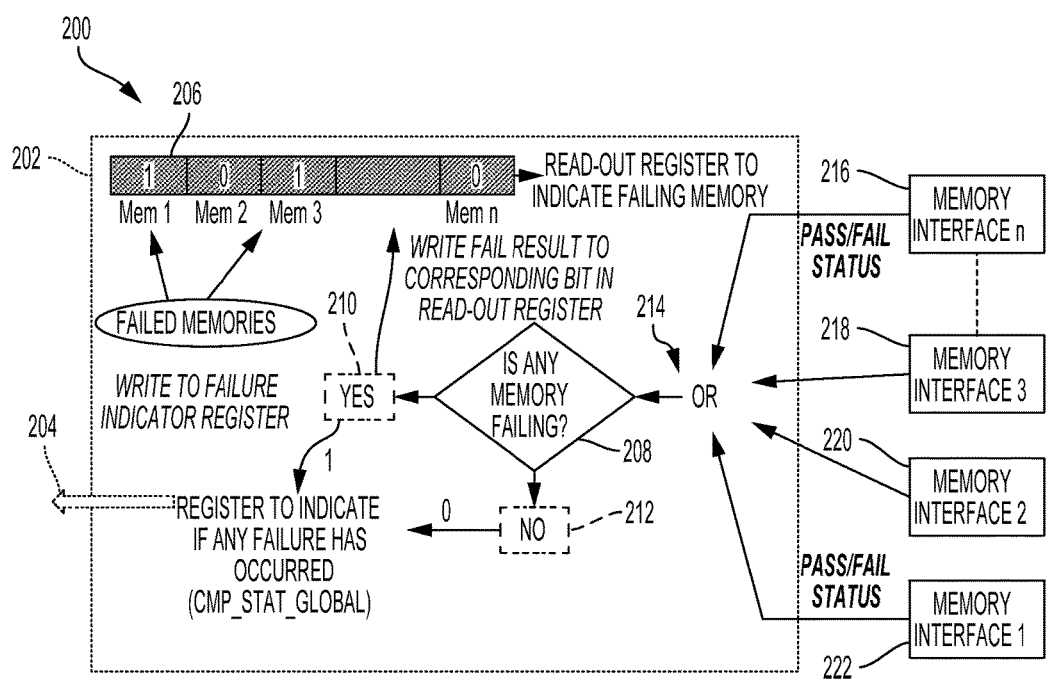
FIG. 2 illustrates operation of the apparatus for testing memory fail signatures in parallel in accordance with embodiments described herein.

FIG. 2 illustrates an implementation of a method and apparatus for optimized memory test status detection and debug. The assembly 200 includes a system-on-chip 202 that incorporates memories 206. Multiple memories 206 may be included within SoC 202. As depicted in FIG. 2, memories 1 and 3 are failed memories. The failed memories are read out in a read-out register that indicates specifically which memories on SoC 202 have failed. SoC 202 also includes output 204 which provides a chip level general purpose input/output (GPIO) pin. This GPIO pin 204 is used to output results of the testing to the MBIST controller 112 (shown in FIG. 1). In operation, at step 208 the query "Is any memory failing?" is posed as part of the MBIST process. At block 210 if the answer is "Yes" then the fail result is written to the corresponding bit in a Read-out Register. If the answer is no, then in block 212, testing continues. Alternatively, at block 214, the status may be given in terms of an "OR" response. Each memory interface 216 through 222 (with an interface for each memory, up to N memory interfaces) may be queried for Pass/Fail status.

Figure 3:
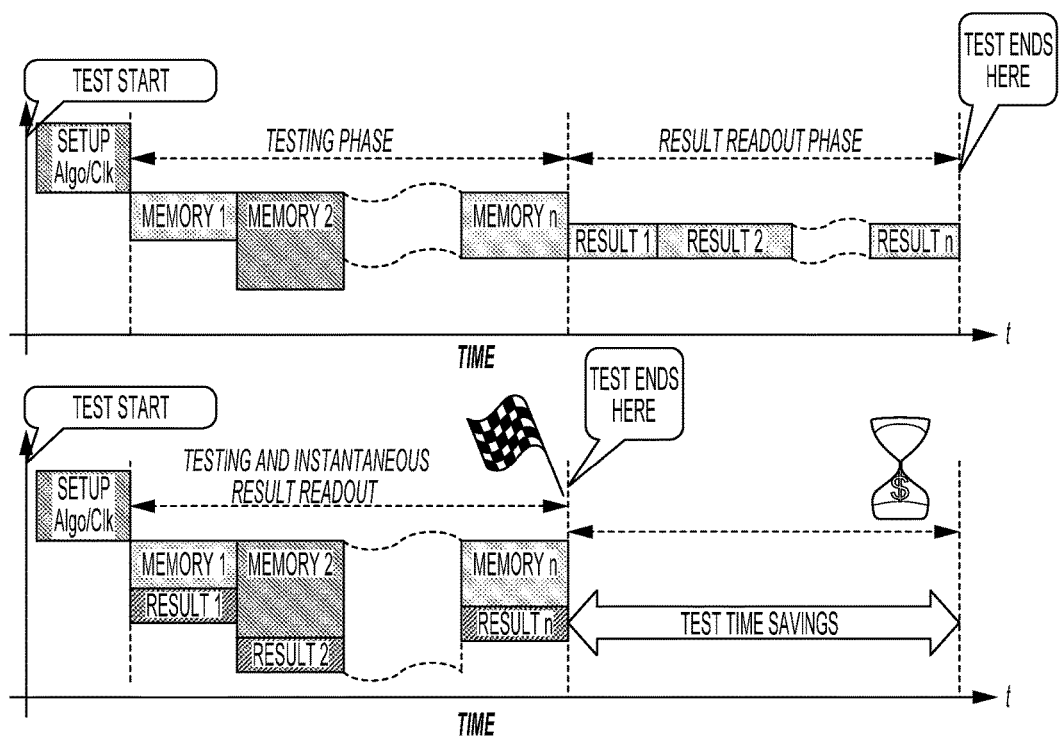
FIG. 3 provides a comparison of test time for current testing methods in comparison with the embodiments described herein.

FIG. 3 provides a comparison between current memory testing methods and the methods described herein. The first chart shows the steps required for testing using current methods. The test begins with a set up phase. During the set up phase algorithms and clock standards are specified and may be loaded into the MBIST controller. Once the set up has been completed, MBIST testing begins, with memory 1 being tested, followed by memory 2, and so on until all N memories have been tested. After the testing phase has been completed, the result readout phase begins. In this phase, result 1 is read out first, followed sequentially by result 2, and so on until all results have been read out. The test concludes when all results are read out. As is shown in the figure, the current methods test and read out results in a serial fashion.

In contrast, a method such as that described herein provides for parallel testing and read out. The test begins with a set up phase. In the set up phase testing algorithms and clock values are programmed. These results may be programmed into a MBIST controller which may store test instructions. After set up is complete, testing begins. Memory 1 is tested first, and results are read out immediately. Memory 2 test and read out follows as shown in FIG. 3. This process continues until all N memories have been both tested and read out. At this point, testing is complete, with both testing and read out completed at the same point in time.

Figure 4:
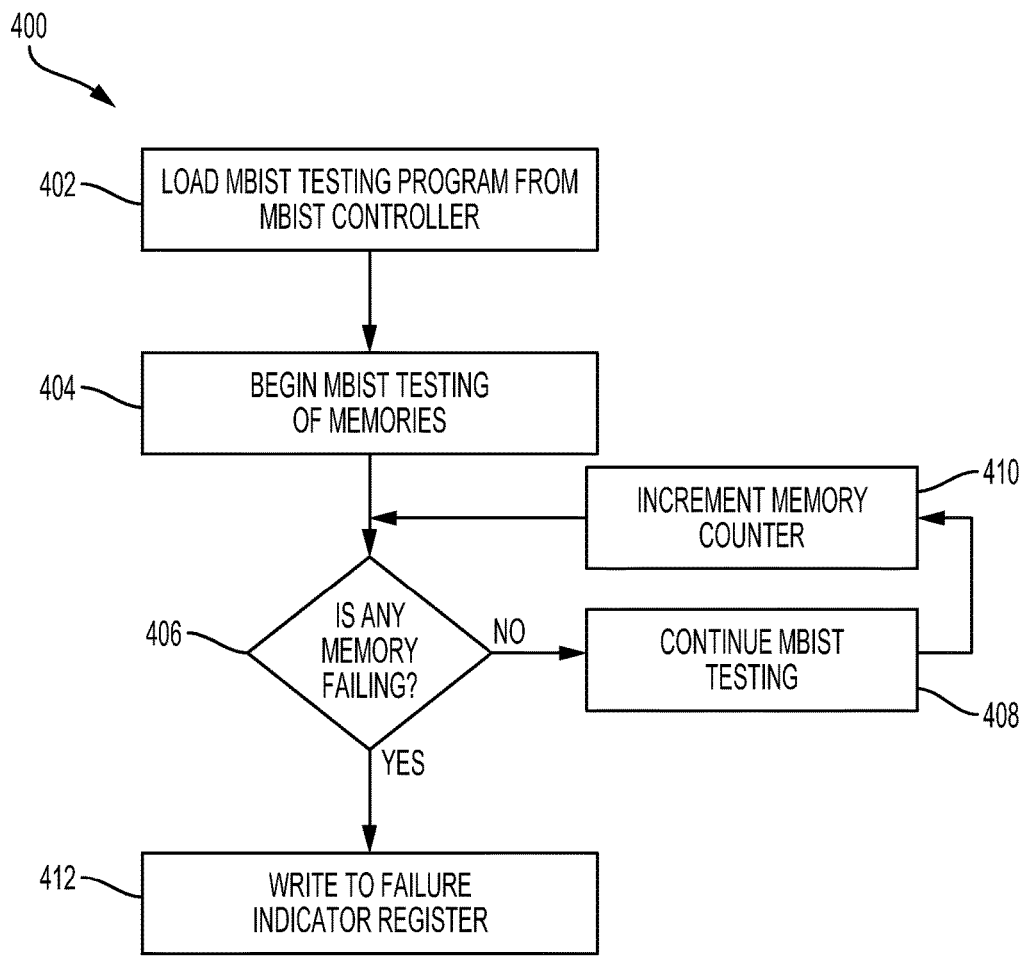
FIG. 4 is a flowchart of a method for testing memory fail signatures in parallel in accordance with embodiments described herein.

FIG. 4 is a flowchart of a method for optimized memory test status detection and debug in accordance with embodiments described herein. The method 400 begins when a MBIST testing program is loaded from the MBIST controller in step 402. Once the test program has been loaded MBIST testing begins in step 404. The testing continues. At a desired point in the testing program the query "Is any memory failing?" is posed in step 406. If no memories are failing, a NO answer at step 406, then MBIST testing continues in step 408. A memory counter 713 (FIG. 7) is incremented in step 410. If however, the answer is YES, and a memory or memories are failing, then the failure is written to the failure indicator register in step 412. The failure indicator register indicates which memories have failed. The failure results are read-out from the Read-out Register as part of step 412.

Figure 5:
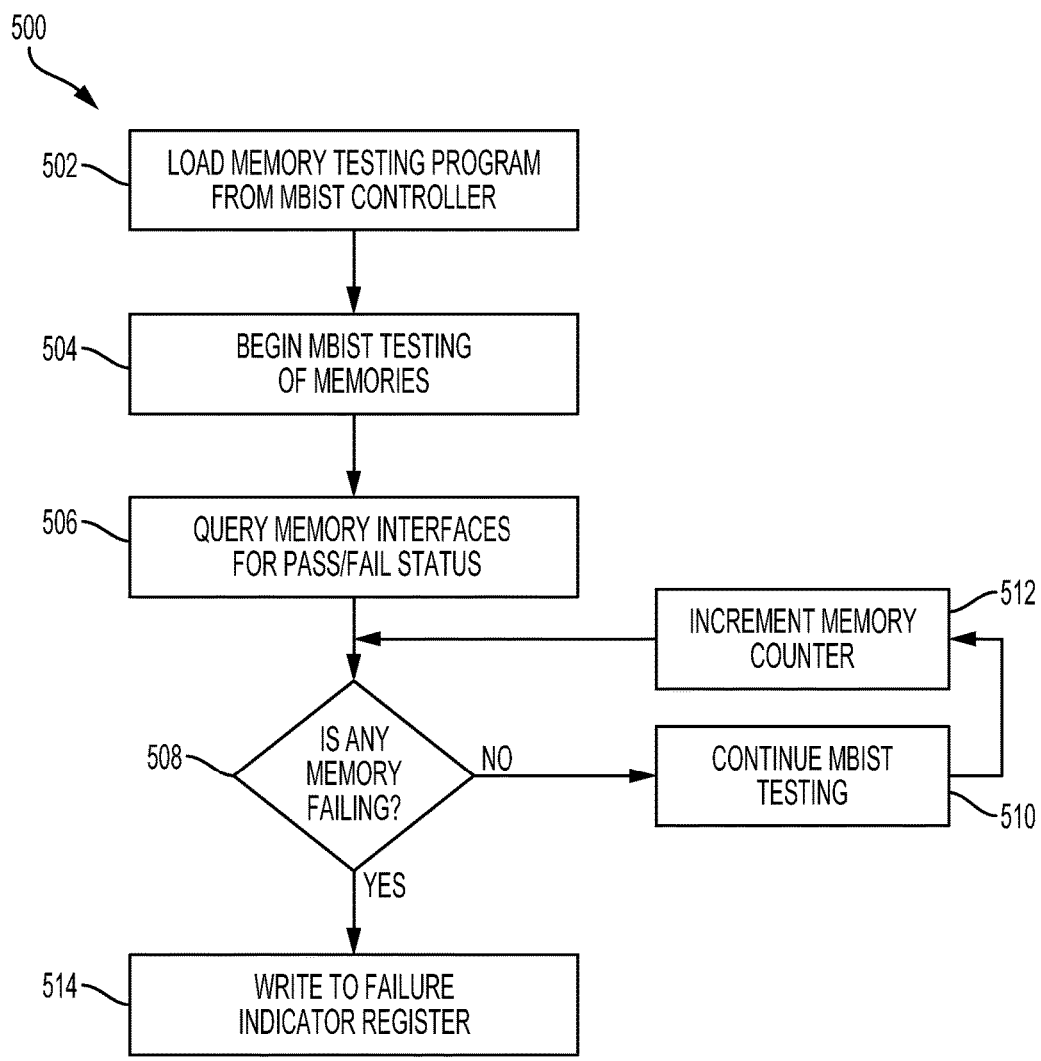
FIG. 5 is a flowchart of an alternate method for testing memory fail signatures in accordance with embodiments described herein.

FIG. 5 is a flowchart of an alternate method for optimized memory test status detection and debug in accordance with embodiments described herein. The method 500 begins when a MBIST testing program is loaded from the MBIST controller in step 502. After loading, MBIST testing begins in step 504. Testing continues until step 506 when the memory interfaces are queried for pass/fail status. Each memory interface reports status as part of step 506. The query asks in step 508 "Is any memory failing?". If no memories are failing, then in step 510 MBIST testing continues. Then in step 512 a memory counter 713 (FIG. 7) is incremented. If memories are determined to be failing, then in step 514 the failure is written to the failure indicator register in step 514. As part of step 514 the failure results are read-out to the corresponding bit in the Read-out Register.

Figure 6:
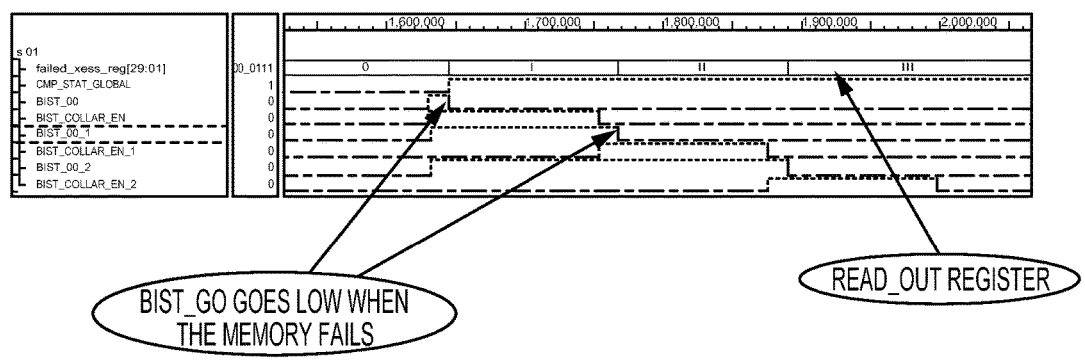
FIG. 6 illustrates the methodology used for testing memory fail signatures in parallel in accordance with embodiments described herein.

FIG. 6 illustrates the methodology of testing memory fail signatures in parallel in accordance with embodiments described herein. As shown in FIG. 6 the signal BIST_GO signal goes low when a memory fails. This result is provided to the READ-OUT register. The result is that pass/fail results (CMP_STAT_GLOBAL) are available the moment that any memory on the SoC fails. This is possible because bits are set in the Read-out register (failed_mems_reg) identify which memories are failing. A typical embodiment may use less than 20 gates and three registers, which negligibly affects area on a typical SoC.

Figure 7:
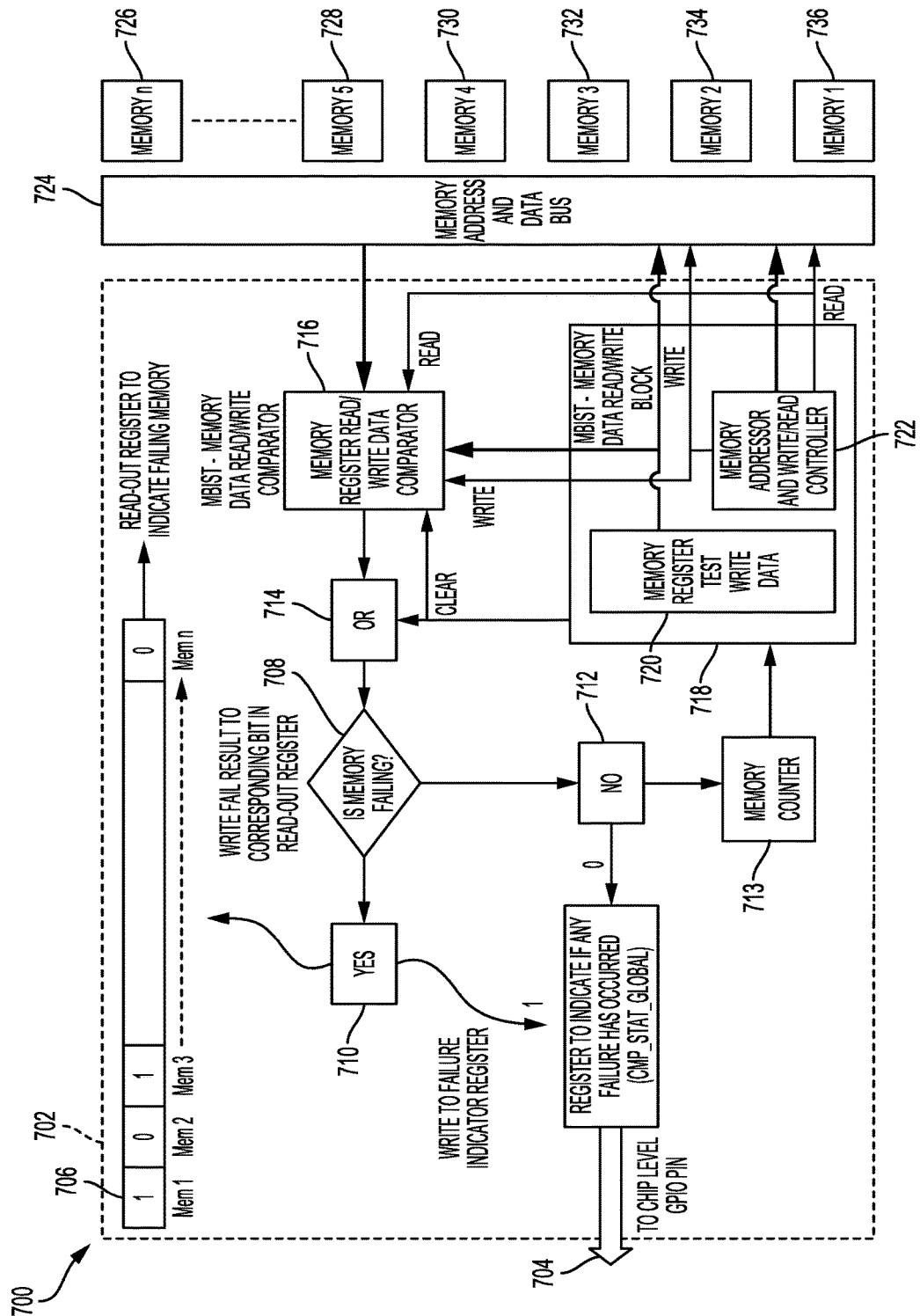
FIG. 7 is a block diagram of a further embodiment of an apparatus for testing memory fail signatures in accordance with embodiments described herein.

FIG. 7 illustrates a further embodiment of an apparatus for optimized memory test status detection and debug. The assembly 700 includes a SoC 702 that incorporates memories 706. Multiple memoires 706 may be included within SoC 702. Any failed memories are read out in a read-out register that indicates which memories on SoC 702 have failed. SoC 702 also provides output 704 which provides a chip level GPIO pin. GPIO pin 704 outputs test results to the MBIST controller 112, shown in FIG. 1. In operation at step 708 the query "Is any memory failing" is posed during the MBIST testing process. At block 710 if the answer is "Yes", then the fail result is written to the corresponding bit in a Read-out Register. If the answer is "No", then in block 712 testing continues.

As an alternative process to that described above, at step 714, the status of the tested memories may be determined by querying each memory through memory address and data bus 724. Memories 726-736 may report pass/fail status over the memory address and data bus 724. This pass/fail information is provided from the memory address and data bus 724 to memory register Read/Write data comparator 716. The data comparator 716 may also receive input from MIBST test block 718, which includes the memory register test write data block 720 and the memory addressor and Write/Read controller 722. The memory register 720 and memory addressor contained within MBIST test block 718 are in both read and write communication with the memory address and data bus 724. In operation, each memory communicates through the memory address and data bus 724 may be queried for pass/fail status.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of memory built-in self-testing (MBIST), comprising:
   executing, by a memory built-in self-testing (MBIST) controller, a testing program stored at a memory circuit;
   testing, by the MBIST controller, a plurality of memories using the testing program;
   determining, via a memory register read/write data comparator, if any memory of the plurality of memories fails testing when data read out from the memory of the plurality of memories fails to match test data written to the memory of the plurality of memories;
   writing, by the MBIST controller, at least one failure result value to a read-out register if a determination is made that at least one memory of the plurality of memories failed testing, the at least one failure result value written to the read-out register in parallel with ongoing testing of the plurality of memories using the testing program; and
   reading out, by the MBIST controller, the failure result value from the read-out register while testing of the plurality of memories using the testing program is ongoing.

2. The method of claim 1, wherein testing the plurality of memories using the testing program continues until a determination is made that a memory of the plurality of memories failed testing.

3. The method of claim 2, further comprising:
   starting, by the MBIST controller, a memory counter when a first memory of the plurality of memories is tested; and
   incrementing, by the MBIST controller, a memory counter after each memory of the plurality of memories is tested until a determination is made that a memory of the plurality of memories failed testing or testing of the plurality of memories terminates.

4. The method of claim 1, further comprising:
   querying, by the memory register read/write data comparator, memory interfaces of the plurality of memories to read out data stored at the plurality of memories to determine if any memory of the plurality of memories fails testing.

5. The method of claim 1, wherein the read-out register stores a failure result value for each memory of the plurality of memories being tested using the testing program.

6. The method of claim 5, wherein each failure result value for each memory of the plurality of memories may be accessed and read-out, by the MBIST controller, while testing of the plurality of memories using the testing program is ongoing.

7. The method of claim 1, further comprising:
   writing, to a global register, a value indicating that at least one memory of the plurality of memories failed testing, the global register coupled to a general input/output pin that allows the value stored at the global register to be read.

8. An apparatus for memory built-in self-testing (MBIST), comprising:
   a read-out register adapted to store data; and
   an MBIST controller communicatively coupled to the read-out register, the MBIST controller adapted to
      execute a testing program stored at a memory circuit,
      test a plurality of memories using the testing program,
      determine if any memory of the plurality of memories fails testing when data read out from the memory of the plurality of memories fails to match test data written to the memory of the plurality of memories,
      write at least one failure result value to the read-out register if a determination is made that at least one memory of the plurality of memories failed testing, the at least one failure result value written to the read-out register in parallel with ongoing testing of the plurality of memories using the testing program, and
      read out the failure result value from the read-out register while testing of the plurality of memories using the testing program is ongoing.

9. The apparatus of claim 8, wherein the MBIST controller is further adapted to continue testing of the plurality of memories until a determination is made that a memory of the plurality of memories failed testing.

10. The apparatus of claim 8, further comprising a memory register that contains test write data.

11. The apparatus of claim 8, wherein the MBIST controller is further adapted to:
   start a memory counter when a first memory of the plurality of memories is tested; and
   increment the memory counter after each memory of the plurality of memories is tested until a determination is made that a memory of the plurality of memories failed testing or testing of the plurality of memories terminates.

12. The apparatus of claim 8, wherein the read-out register stores a failure result value for each memory of the plurality of memories being tested using the testing program.

13. An apparatus for memory built-in self-testing (MBIST), comprising:
   means for executing a testing program stored at a memory circuit;
   means for testing a plurality of memories using the testing program;
   means for determining if any memory of the plurality of memories fails testing when data read out from the memory of the plurality of memories fails to match test data written to the memory of the plurality of memories;
   means for writing at least one failure result value to a read-out register if a determination is made that at least one memory of the plurality of memories failed testing, the at least one failure result value written to the read-out register in parallel with ongoing testing of the plurality of memories using the testing program; and
   means for reading out the failure result value from the read-out register while testing of the plurality of memories using the testing program is ongoing.

14. The apparatus of claim 13, further comprising:
   means for starting a memory counter when a first memory of the plurality of memories is tested; and
   means for incrementing the memory counter after each memory of the plurality of memories is tested until a determination is made that a memory of the plurality of memories failed testing or testing of the plurality of memories terminates.

15. The apparatus of claim 13, further comprising:
means for querying memory interfaces of the plurality of memories to read out data stored at the plurality of memories to determine if any memory of the plurality of memories fails testing.

16. The apparatus of claim 12, wherein each failure result value for each memory of the plurality of memories may be accessed and read-out, by the MBIST controller, while testing of the plurality of memories using the testing program is ongoing.

17. The apparatus of claim 13, wherein the read-out register stores a failure result value for each memory of the plurality of memories being tested using the testing program.

18. The apparatus of claim 17, wherein each failure result value for each memory of the plurality of memories may be accessed and read-out, by the MBIST controller, while testing of the plurality of memories using the testing program is ongoing.

* * * * *